United States Patent
Abbasfar

(10) Patent No.: US 9,479,363 B2
(45) Date of Patent: Oct. 25, 2016

(54) PARTIAL RESPONSE RECEIVER AND RELATED METHOD

(71) Applicant: Rambus Inc., Sunnyvale, CA (US)

(72) Inventor: Aliazam Abbasfar, San Diego, CA (US)

(73) Assignee: Rambus Inc., Sunnyvale, CA (US)

(*) Notice: Subject to any disclaimer, the term of this patent is extended or adjusted under 35 U.S.C. 154(b) by 0 days.

(21) Appl. No.: 14/937,558

(22) Filed: Nov. 10, 2015

(65) Prior Publication Data

US 2016/0134440 A1    May 12, 2016

Related U.S. Application Data

(63) Continuation of application No. 14/705,761, filed on May 6, 2015, now Pat. No. 9,215,103, which is a continuation of application No. 14/148,470, filed on Jan. 6, 2014, now Pat. No. 9,054,907, which is a continuation of application No. 13/729,831, filed on Dec. 28, 2012, now Pat. No. 8,630,336, which is a continuation of application No. 12/835,500, filed on Jul. 13, 2010, now Pat. No. 8,345,738.

(60) Provisional application No. 61/228,348, filed on Jul. 24, 2009.

(51) Int. Cl.
| | |
|---|---|
| *H04L 25/03* | (2006.01) |
| *H04L 25/497* | (2006.01) |
| *H03K 5/135* | (2006.01) |
| *H03K 5/15* | (2006.01) |

(52) U.S. Cl.
CPC ......... *H04L 25/03019* (2013.01); *H03K 5/135* (2013.01); *H03K 5/15* (2013.01); *H04L 25/03878* (2013.01); *H04L 25/03885* (2013.01); *H04L 25/497* (2013.01)

(58) Field of Classification Search
CPC ................................ H04L 27/00; H03H 3/70
See application file for complete search history.

(56) References Cited

U.S. PATENT DOCUMENTS

| | | | |
|---|---|---|---|
| 3,829,664 A * | 8/1974 | Kashio | G06F 7/24 340/146.2 |
| 7,126,378 B2 | 10/2006 | Stojanovic et al. | |

(Continued)

OTHER PUBLICATIONS

Kasturia et al., "Techniques for High-Speed Implementation of Nonlinear Cancellation," IEEE Journal on Selected Areas in Communications, vol. 9, No. 5, Jun. 1991, pp. 711-717. 7 pages.

(Continued)

*Primary Examiner* — Jaison Joseph
(74) *Attorney, Agent, or Firm* — Silicon Edge Law Group LLP; Arthur J. Behiel

(57) ABSTRACT

A multi-phase partial response equalizer circuit includes sampler circuits that sample an input signal to generate sampled signals in response to sampling clock signals having different phases. A first multiplexer circuit selects one of the sampled signals as a first sampled bit to represent the input signal. A first storage circuit coupled to an output of the first multiplexer circuit stores the first sampled bit in response to a first clock signal. A second multiplexer circuit selects one of the sampled signals as a second sampled bit to represent the input signal based on the first sampled bit. A second storage circuit stores a sampled bit selected from the sampled signals in response to a second clock signal. A time period between the second storage circuit storing a sampled bit and the first storage circuit storing the first sampled bit is substantially greater than a unit interval in the input signal.

20 Claims, 12 Drawing Sheets

(56) References Cited

U.S. PATENT DOCUMENTS

| | | | |
|---|---|---|---|
| 7,199,615 B2 | 4/2007 | Stojanovic et al. | |
| 7,308,048 B2 | 12/2007 | Wei | |
| 7,336,729 B2 | 2/2008 | Agazzi | |
| 7,397,848 B2 * | 7/2008 | Stojanovic | H04L 25/063 375/229 |
| 7,412,016 B2 | 8/2008 | Stojanovic | |
| 7,433,397 B2 * | 10/2008 | Garlepp | H04L 25/063 375/229 |
| 8,391,347 B2 * | 3/2013 | Kim | G11C 7/02 375/229 |
| 2009/0010320 A1 * | 1/2009 | Hollis | H03K 3/356113 375/232 |
| 2011/0249774 A1 * | 10/2011 | Thakkar | H04L 25/03057 375/316 |

OTHER PUBLICATIONS

Stojanovic et al., "Adaptive Equalization and Data Recovery in a Dual-Mode (PAM2/4) Serial Link Transceiver," Rambus, Inc., Department of Electrical Engineering, Stanford University, Jan. 2004. 4 pages.

Wang, Li, et al., "An Improved Decision Feedback Loop for Optical Communication", pp. 3. University of Paderborn, Warburger, Germany; publication date Mar. 24, 2004. 3 Pages.

* cited by examiner

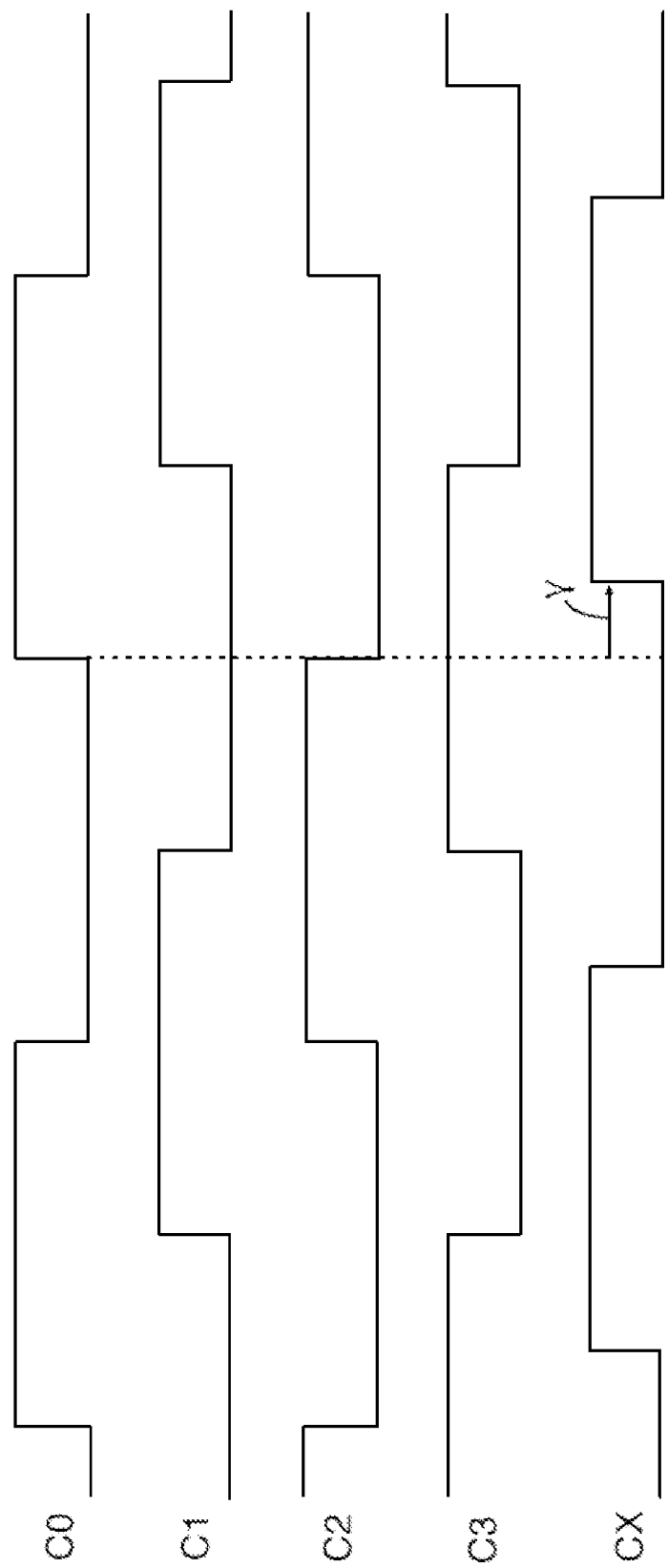

PARTIAL RESPONSE RECEIVER AND RELATED METHOD

BACKGROUND

The present disclosure relates to electronic circuits, and more particularly, to a partial response receiver and related methods.

In digital systems, data is transmitted as a sequence of level-encoded electrical pulses (i.e., bits) through a signaling path. Electrical pulses transmitted on a band-limited signaling path disperse in time as they travel from a transmitter to a receiver. Time-domain dispersion results in a blending of neighboring pulses. This effect is known as dispersion-type inter-symbol interference (ISI). Dispersion-type ISI becomes more pronounced at faster signaling rates, ultimately degrading the signal quality to the point at which distinctions between originally transmitted signal levels may be lost.

A partial response equalizer (PRE) can be used in a receiver to mitigate dispersion-type ISI that results from transmitting data through a signaling path. A PRE compares each bit in an incoming data signal to multiple threshold levels. The threshold levels are selected based on possible digital sequences of one or more previously received bits in the incoming data signal.

FIG. 1 illustrates a prior art double data rate (DDR) partial response equalizer 100 that samples two bits in an incoming data signal during each period of a sampling clock signal. Sampler circuits 101A-101D compare the incoming data signal $V_{IN}$ to thresholds +/−α along parallel sampling paths to generate sampled bits DPE, DNE, DPO, and DNO, respectively. Sampler circuits 101A-101B are driven by clock signal CLK, and sampler circuits 101C-101D are driven by clock signal CLKB. CLK and CLKB are driven out of phase. Each of multiplexers 104A-104B selects one of the sampled bits based on a previously sampled bit, DO and DE, respectively. The sampled bits selected by multiplexers 104A-104B are stored in latches 105A-105B in response to CLKB and CLK as previously sampled bits DE and DO, respectively.

The delay of the longest feedback path in PRE 100 is shown below in equation (1).

$$T_{C,Q} + T_{MUX,SO} + T_{SU} < 1(UI) \quad (1)$$

In equation (1), $T_{C,Q}$ is the clock-to-Q output delay of each of latches 105A and 105B, $T_{MUX,SO}$ is the select-to-output delay of each of multiplexers 104A and 104B, $T_{SU}$ is the setup delay of each of latches 105A and 105B, and UI is one unit interval (i.e., bit period) in $V_{IN}$. Sampling $V_{IN}$ along parallel paths in circuit 100 does not reduce the longest feedback path delay. PRE 100 imposes a lower limit on each unit interval as shown in equation (1). The lower limit on each unit interval may make it difficult to employ conventional partial response designs and their associated benefits as clock rates continue to increase. Therefore, it would be desirable to provide a partial response equalizer that performs the feedback selection in less time.

BRIEF DESCRIPTION OF THE DRAWINGS

FIG. 6B is a timing diagram that illustrates example waveforms for the clock signals of FIG. 6A.

DETAILED DESCRIPTION

A multi-data rate PRE circuit allows extra time for signals to propagate through the PRE circuit between the time when a first sampled bit is stored and the time when a second sampled bit is stored without changing the periods of the clock signals that clock the storage circuits. The time between when the second sampled bit is stored and when the first sampled bit is stored is reduced. This technique reduces a timing constraint and allows the PRE circuit to function at a higher data rate.

A multi-data rate PRE circuit has multiplexers that select sampled bits from among sampled signals generated by sampler circuits based on previously selected values of the sampled bits. A first multiplexer selects a first sampled bit in response to a previously selected sampled bit that is transmitted from an output of a storage circuit. A second multiplexer selects a second sampled bit in response to the first sampled bit without storing the first sampled bit in a storage circuit in the path between the output of the first multiplexer and the select input of the second multiplexer.

Figure 1:
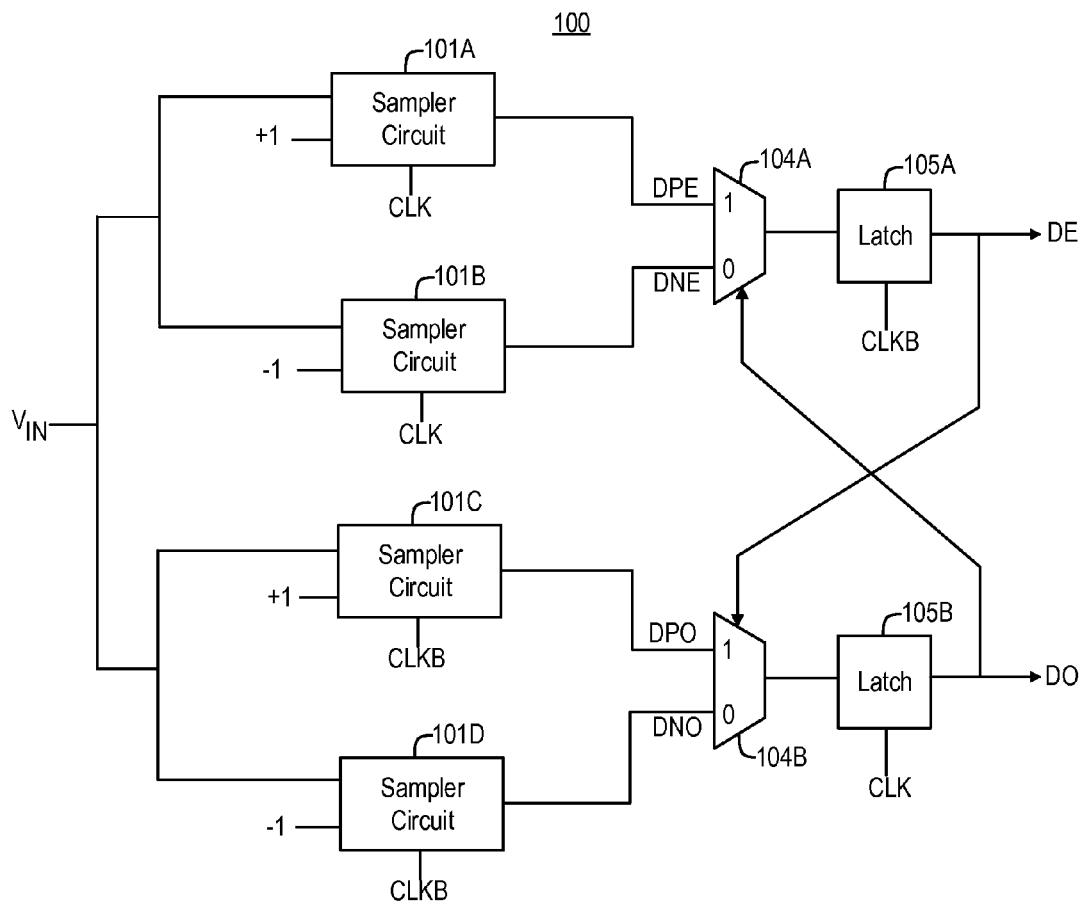
FIG. 1 illustrates a prior art partial response equalizer that samples two bits in an incoming data signal during each period of a sampling clock signal.
Figure 2:
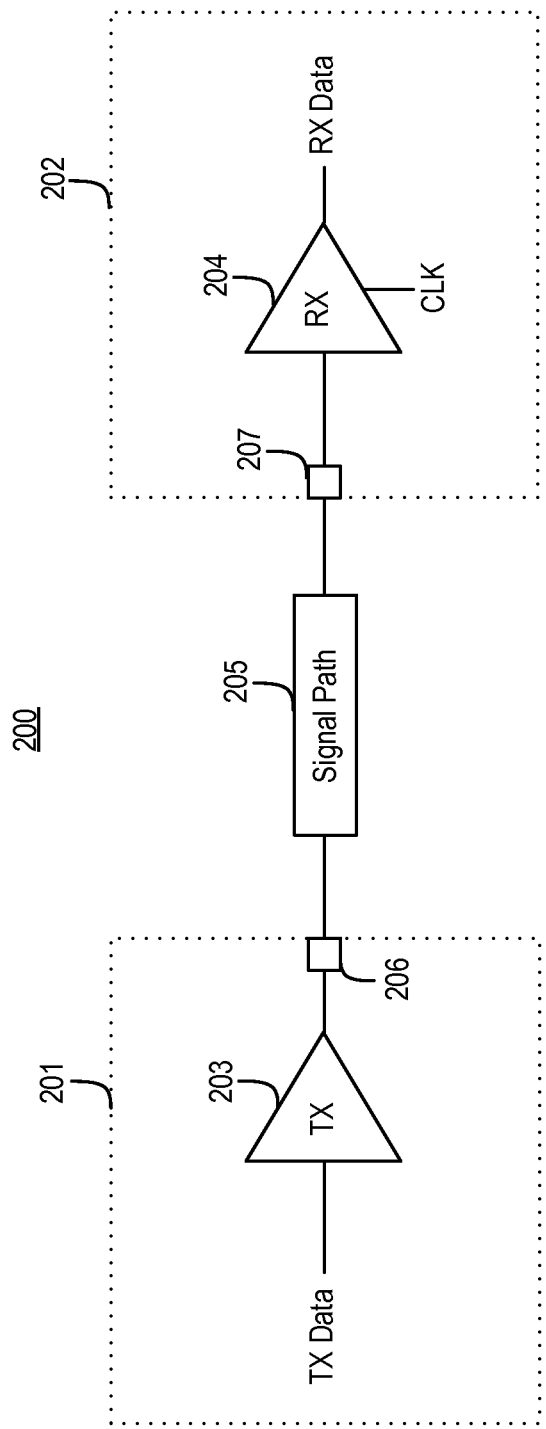
FIG. 2 illustrates a system that includes a transmitter on a first integrated circuit that transmits signals through a signal path to a receiver on a second integrated circuit.

FIG. 2 illustrates a system 200 that transmits data from one integrated circuit to another integrated circuit. System 200 includes a transmitter (TX) circuit 203 on integrated circuit 201 and a receiver (RX) circuit 204 on integrated circuit 202. Transmitter circuit 203 drives a data signal to receiver circuit 204. The data signal driven by transmitter circuit 203 is transmitted from the output terminal of transmitter circuit 203 through output pin 206, signal path 205, and input pin 207 to an input terminal of receiver circuit 204. Receiver circuit 204 samples the data signal to generate sampled bits RX Data that are representative of bits in the data signal in response to a sampling clock signal CLK. Receiver circuit 204 drives the sampled bits to other circuitry (not shown). Pin 206 is an output pin on integrated circuit 201, and pin 207 is an input pin on integrated circuit 202. Signal path 205 is outside integrated circuits 201 and 202.

The data signal may pick up inter-symbol interference (ISI) while being transmitted from transmitter 203 to receiver 204. A partial response equalizer (PRE) circuit is located in receiver circuit 204 on integrated circuit 202. Although not separately depicted in FIG. 2, the PRE circuit is described with reference to FIG. 3A.

Figure 3A:
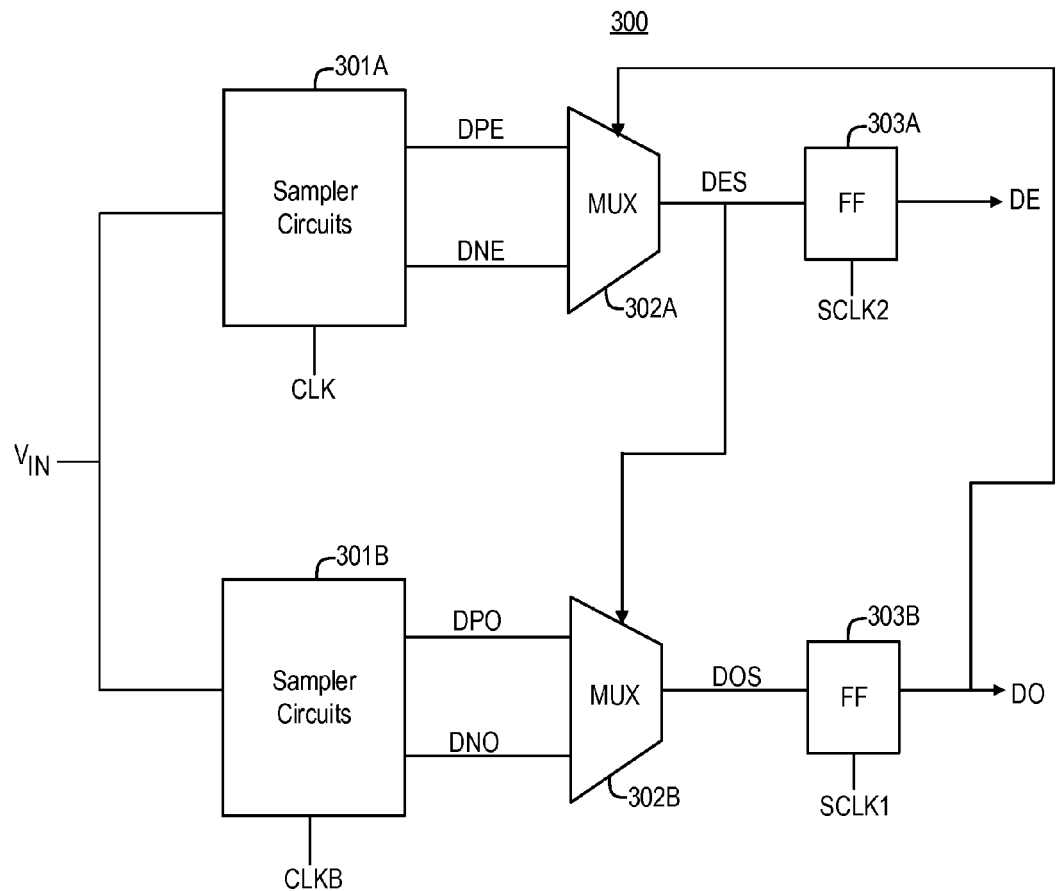
FIG. 3A illustrates a block diagram of a partial response equalizer (PRE) circuit that uses a time borrowing technique and that generates each sampled bit using the value of one previously sampled bit.

FIG. 3A illustrates a block diagram of a partial response equalizer (PRE) circuit 300 that uses a time borrowing technique and that generates each sampled bit using the value of one previously sampled bit. PRE circuit 300 is referred to as a 1-tap PRE circuit. PRE circuit 300 samples an input signal that has a double data rate with respect to the sampling clock signal.

Input voltage signal $V_{IN}$ often picks up inter-symbol interference (ISI) while being transmitted from a transmitter to a receiver. ISI is a degradation of a signal that is caused when one bit in a bit stream interferes with one or more adjacent bits in the bit stream. A partial response equalizer circuit generates multiple samples of a current bit in an input signal using different ISI possibilities from one or more previous bits, to produce multiple conditionally generated signal samples. The PRE uses the multiple signal samples to proceed with sampling of the current bit and then, as the earlier bit is resolved, the PRE circuit selects the appropriate sampled value (i.e., based on the proper threshold given the value of the earlier bit) and discards the other conditional samples. The operating speed of the PRE most often depends on the time it takes for the equalizer to determine the value of a bit in the input signal before the equalizer can use the value of that bit to determine the value of the next bit in the input signal.

PRE circuit 300 samples input voltage signal $V_{IN}$ using two clock signals CLK and CLKB to generate sampled signals. Clock signals CLK and CLKB are 180° out of phase with each other. PRE circuit 300 then selects one of the sampled signals as a sampled bit that represents a bit in the input signal $V_{IN}$ for each unit interval. Each unit interval is a bit period in the input signal $V_{IN}$. Two unit intervals occur in each clock period of clock signals CLK and CLKB. $V_{IN}$ has a double data rate with respect to CLK (or CLKB). Sampled bits DE and DO represent two parallel data streams ("even" and "odd") that are each generated at a single data rate.

Figure 3B:
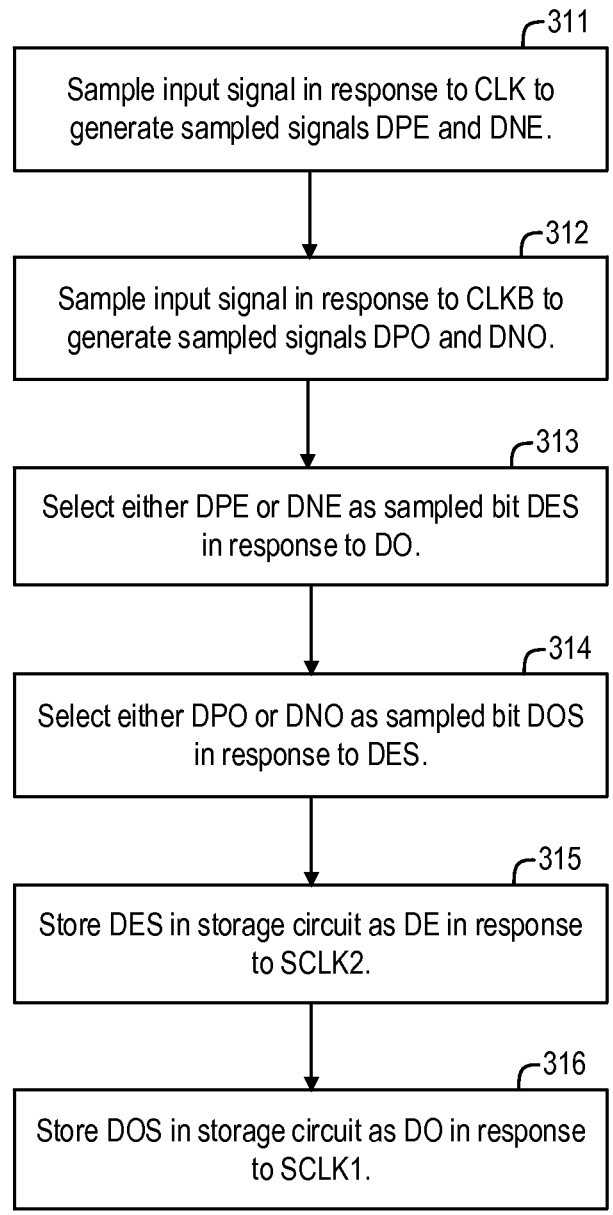
FIG. 3B is a flow chart that illustrates a process performed by the PRE circuit of FIG. 3A.

PRE circuit 300 includes sampler circuits 301A-301B, multiplexer circuits 302A-302B, and flip-flops 303A-303B. FIG. 3B is a flow chart that illustrates a process performed by PRE 300 in steps 311-316.

Sampler circuit 301A samples input signal $V_{IN}$ in response to clock signal CLK to generate sampled signals DPE and DNE at step 311 shown in FIG. 3B. Sampler circuit 301B samples input signal $V_{IN}$ in response to clock signal CLKB to generate sampled signals DPO and DNO at step 312. The DPE and DPO signals are conditionally generated assuming the immediately prior bit to have been a "logic 1," and the DNE and DNO signals are conditionally generated assuming the immediately prior bit to have been a "logic 0."

Multiplexer 302A then selects either DPE or DNE as a sampled bit DES in each clock period of CLK in response to a previously sampled bit DO at step 313. Sampled bit DES represents a bit in the input signal $V_{IN}$. Multiplexer 302B selects either DPO or DNO as sampled bit DOS in each clock period of CLKB in response to sampled bit DES at step 314. Sampled bit DOS represents a bit in the input signal $V_{IN}$ that is received by PRE 300 after DE. Because each of the sampled bits DES and DOS is selected based on the value of one previously sampled bit, PRE 300 is a 1-tap PRE circuit.

Flip-flop 303A stores the value of sampled bit DES as stored sampled bit DE in response to clock signal SCLK2 at step 315. Flip-flop 303B stores the value of sampled bit DOS as stored sampled bit DO in response to clock signal SCLK1 at step 316.

The output signal DO of flip-flop 303B is transmitted from the output of flip-flop 303B to the select input of multiplexer 302A. The output signal DES of multiplexer 302A is transmitted directly to the select input of multiplexer 302B without being stored in a storage circuit in the path between the output of multiplexer 302A and the select input of multiplexer 302B. This configuration of PRE circuit 300 allows the delay between flip-flop 303B storing an updated value of DO and flip-flop 303A storing an updated value of DE to be increased, and the delay between flip-flop 303A storing an updated value of DE and flip-flop 303B storing an updated value of DO to be decreased, without changing the duration of the periods of SCLK1 and SCLK2.

Figure 3C:
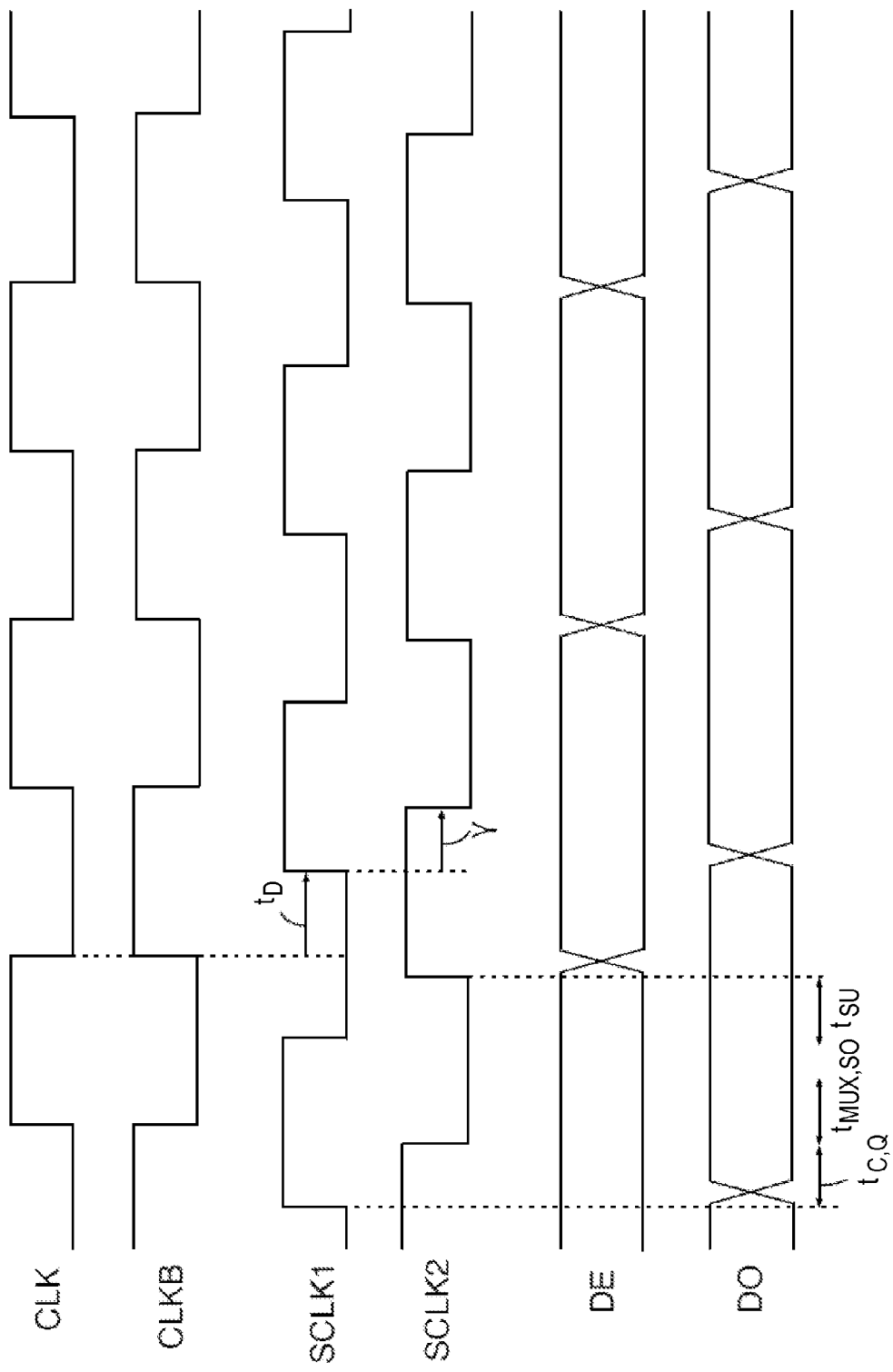
FIG. 3C is a timing diagram that illustrates example waveforms for some of the signals in the PRE circuit of FIG. 3A.

FIG. 3C illustrates example waveforms for signals CLK, CLKB, SCLK1, SCLK2, DE, and DO. As shown in FIG. 3C, clock signal SCLK1 is delayed by a delay of $t_D$ relative to the phase of clock signal CLKB. The falling edge of clock signal SCLK2 is delayed relative to the rising edge of clock signal SCLK1 by a delay of γ. In the example of FIG. 3C, each of the clock signals CLK, CLKB, SCLK1, and SCLK2 has a 50% duty cycle. In alternative embodiments, clock signals CLK, CLKB, SCLK1, and SCLK2 have duty cycles that are greater than or less than 50%. There are many different techniques for generating clock signals SCLK1 and SCLK2. For example, SCLK1 and SCLK2 can be generated using one or more delay circuits (e.g., one or more inverters) that delay CLK or CLKB to generate SCLK1 and SCLK2. Clock signals SCLK1 and SCLK2 can also be generated, for example, by a delay-locked loop, a phase mixer, or a phase-locked loop.

Between each rising edge in SCLK1 and the next rising edge in SCLK2, a clock-to-Q output delay $T_{C,Q}$ occurs in flip-flop 303B, then a select-to-output delay $T_{MUX,SO}$ occurs in multiplexer 302A, and then a setup delay $T_{SU}$ occurs in flip-flop 303A, as shown, for example, at the bottom of FIG. 3C. The delay between each rising edge in SCLK1 and the next rising edge in SCLK2 equals one unit interval (UI) plus γ. The delay between each rising edge in SCLK1 and the next rising edge in SCLK2 in PRE circuit 300 is constrained by equation (2).

$$T_{C,Q} + T_{MUX,SO} + T_{SU} < 1(\text{UI}) + \gamma \qquad (2)$$

As discussed above, each rising edge in SCLK1 causes flip-flop 303B to store the value of DOS as sampled bit DO, and each rising edge in SCLK2 causes flip-flop 303A to store the value of DES as sampled bit DE. The delay between each rising edge in SCLK1 and the next rising edge of SCLK2 is increased by γ to provide additional time to complete the delay $T_{C,Q} + T_{MUX,SO} + T_{SU}$ through flip-flop 303B, multiplexer 302A, and flip-flop 303A. The delay between each rising edge of SCLK2 and the next rising edge of SCLK1 is reduced by γ. The relative phases of SCLK1 and SCLK2 can be shifted by γ without changing the duration of the periods of SCLK1 and SCLK2. This technique is an example of time borrowing.

Time borrowing refers to a technique in which the time period to sample a first bit in an input data signal is increased by a particular amount so that the time to sample the first bit is greater than one unit interval. The time period to sample a second bit in the input data signal is decreased by the same amount so that the time period to sample the second bit is less than one unit interval. Time borrowing permits the circuitry of FIG. 3A and the other embodiments described herein to be used with a clock signal having a greater frequency than in prior art techniques, because the longest signal path has more time to complete as shown, for example, in equation (2) with respect to PRE circuit 300. Time borrowing can be used to extend the use of a variety of partial response equalizer techniques as clock signal speeds increase.

In one embodiment, the delay γ in PRE circuit 300 is equal to $T_F/2$, where $T_F=T_{C,Q}+T_{SU}$. In this embodiment, the timing constraint of equation (2) becomes $T_{MUX,SO}+T_F/2<1$ (UI), which is less than equation (1) by $T_F/2$.

The longest signal path through PRE circuit 300 is the path from flip-flop 303B, through multiplexers 302A-302B, and back to flip-flop 303B. In PRE circuit 300, the sum of the clock-to-Q delay $T_{C,Q}$ of flip-flop 303B, the select-to-out delay $T_{MUX,SO}$ of multiplexer 302A, the select-to-out delay $T_{MUX,SO}$ of multiplexer 302B, and the setup delay $T_{SU}$ of flip-flop 303B is less than two unit intervals (UI), as shown in equation (3) below, where N=2 in PRE circuit 300. The longest signal path of PRE circuit 300 is less than or equal to one clock period of SCLK1. The constraint shown in equation (3) is not as limiting as the first constraint shown in equation (2) as long as $γ<T_F/2$.

$$T_{C,Q}+N \cdot (T_{MUX,SO})+T_{SU}<N \cdot (\text{UI}) \quad (3)$$

Figure 4:
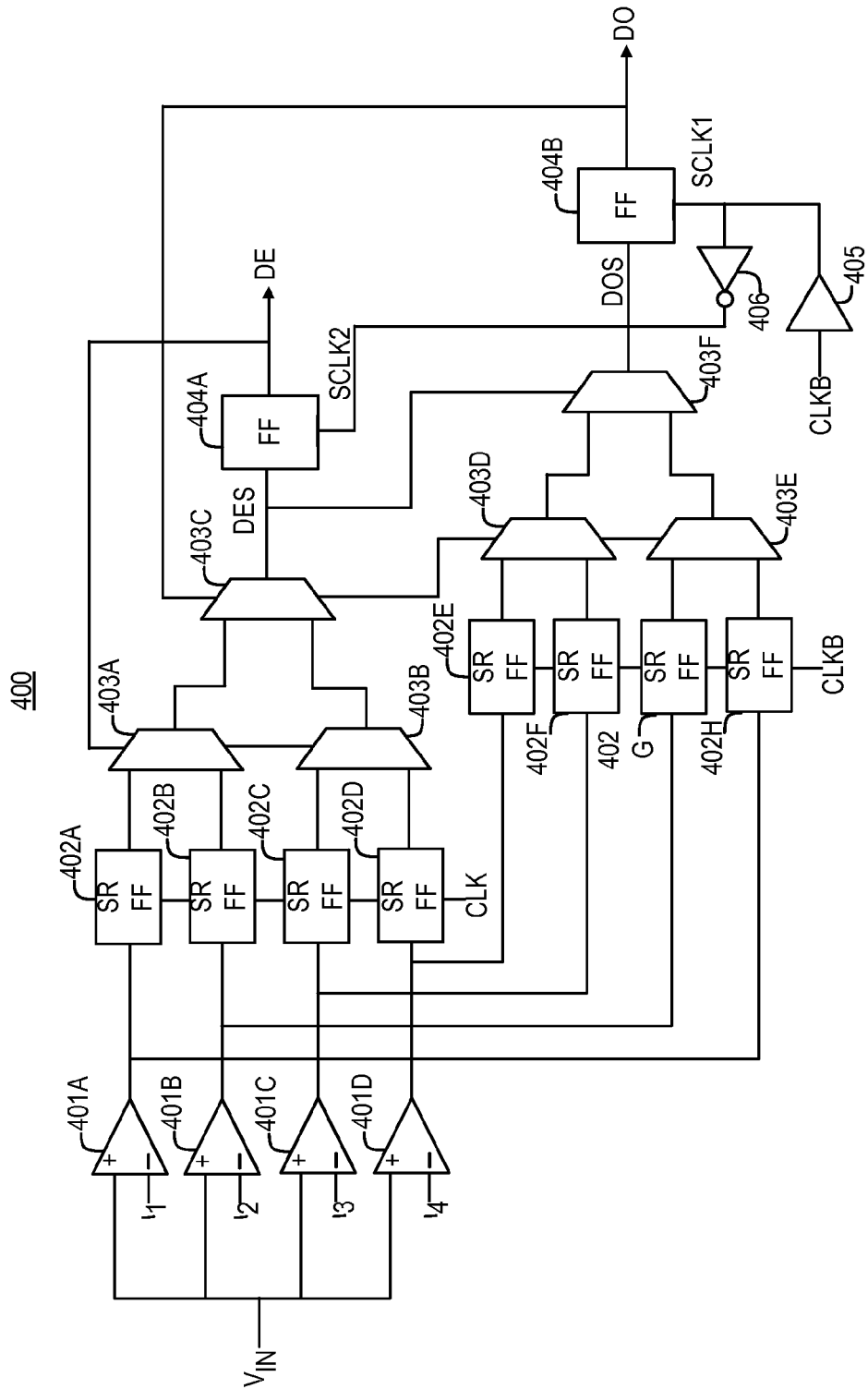
FIG. 4 illustrates an example of a PRE circuit that uses a time borrowing technique and that generates each sampled bit based on the values of two previously sampled bits.

FIG. 4 illustrates an example of a partial response equalizer circuit 400 that uses a time borrowing technique and that generates each sampled bit based on the values of two previously sampled bits. PRE circuit 400 is a 2-tap PRE circuit. PRE circuit 400 samples an input signal that has a double data rate (DDR) with respect to the sampling clock signal. Partial response equalizer (PRE) circuit 400 can be operated at significantly higher data rates than previously known 2-tap DDR PRE circuits.

PRE circuit 400 receives an input voltage signal V that represents an incoming data signal. PRE circuit 400 generates sampled bits from input signal $V_{IN}$ using a time borrowing technique. PRE circuit 400 samples input voltage signal $V_{IN}$ using clock signals CLK and CLKB to generate sampled signals, selects two of the sampled signals as sampled bits that represent input signal $V_{IN}$ in two unit intervals, and stores the sampled bits in storage circuits. Each sampled bit is selected based on the values of two previously sampled bits.

The time intervals between successive rising edges of the clock signals SCLK1 and SCLK2 that drive the storage circuits are substantially different from a unit interval. The delays between a unit interval and the rising edges of SCLK1 and SCLK2 have been inserted intentionally and are not simply the result of clock skews that routing commonly causes in digital integrated circuits.

PRE circuit 400 generates one sampled bit DE (data even) that equals the logic state of the bit in the input signal $V_{IN}$ for each even numbered unit interval. PRE circuit 400 generates one sampled bit DO (data odd) that equals the logic state of the bit in the input signal V for each odd numbered unit interval. Two unit intervals in $V_{IN}$ occur in each clock period of clock signals CLK and CLKB, and each unit interval corresponds to one bit period in $V_{IN}$. PRE circuit 400 generates two sampled bits of data (DE and DO) that represent the input signal $V_{IN}$ in two unit intervals. $V_{IN}$ has a double data rate with respect to CLK (or CLKB).

PRE circuit 400 includes sense amplifier circuits 401A-401D, set-reset (SR) flip-flops 402A-402H, multiplexers 403A-403F, flip-flops 404A-404B, clock buffer 405, and inverting clock buffer 406. Clock signal CLK is transmitted to inputs of flip-flops 402A-402D, and clock signal CLKB is transmitted to inputs of flip-flops 402E-402H. CLK and CLKB are driven 180° out of phase with each other.

The input voltage signal $V_{IN}$ is transmitted to a first input terminal of each of the sense amplifier circuits 401A-401D. Sense amplifier circuits 401A-401D compare $V_{IN}$ to threshold voltage signals $α_1$, $α_2$, $α_3$, and $α_4$ to generate sampled signals that are provided to inputs of flip-flops 402A and 402H, 402B and 402G, 402C and 402F, 402D and 402E, respectively. The values of $α_1$, $α_2$, $α_3$, and $α_4$ represent magnitudes of the partial response to the preceding bits in input signal $V_{IN}$ caused by ISI, i.e., assuming the preceding bits to have been 00, 01, 10, and 11, respectively.

Sense amplifier circuits 401A-401D and flip-flops 402A-402D are sampler circuits that sample $V_{IN}$ at the rising edge of CLK. Sense amplifier circuits 401A-401D and flip-flops 402E-402H are sampler circuits that sample $V_{IN}$ at the rising edge of CLKB. While there are many variations, FIG. 4 depicts one possible operation of the sampler circuits.

The sampled signals generated by sense amplifier circuits 401A-401D are stored in flip-flops 402A-402D, respectively, when CLK is in a logic high state. The sampled signals generated by sense amplifier circuits 401A-401D are stored in flip-flops 402H, 402G, 402F, and 402E, respectively, when CLKB is in a logic high state.

Multiplexer 403A selects one of the sampled signals stored in flip-flops 402A-402B based on the logic state of previously sampled bit DE, and multiplexer 403B selects one of the sampled signals stored in flip-flops 402C-402D based on the logic state of DE. Multiplexer 403C selects one of the output signals of multiplexers 403A-403B as sampled bit DES based on the logic state of previously sampled bit DO. Flip-flop 404A stores the output signal DES of multiplexer 403C as sampled bit DE in response to a rising edge in clock signal SCLK2.

Multiplexer 403D selects one of the sampled signals stored in flip-flops 402E-402F based on the logic state of sampled bit DO, and multiplexer 403E selects one of the sampled signals stored in flip-flops 402G-402H based on the logic state of DO. Multiplexer 403F selects one of the output signals of multiplexers 403D-403E as sampled bit DOS based on the logic state of DES. Flip-flop 404B stores the output signal DOS of multiplexer 403F as sampled bit DO in response to a rising edge in clock signal SCLK1. Because each sampled bit DES and DOS is selected based on the values of two previously sampled bits, PRE circuit 400 is a 2-tap PRE circuit.

The example waveforms shown in FIG. 3C can also be used to illustrate the operation of FIG. 4. Clock buffer 405 delays clock signal CLKB to generate clock signal SCLK1. SCLK1 is delayed with respect to CLKB by a delay $t_D$ as shown, for example, in FIG. 3C. Inverting clock buffer 406 delays and inverts clock signal SCLK1 to generate clock signal SCLK2. Inverting clock buffer 406 delays inverted SCLK2 by a delay of γ relative to SCLK1 as shown, for example, in FIG. 3C.

PRE circuit 400 uses time borrowing. The delay between each rising edge in SCLK1 and the next rising edge in SCLK2 is constrained by equation (2) shown above. The delay between each rising edge in SCLK1 that causes flip-flop 404B to update DO and the next rising edge of SCLK2 that causes flip-flop 404A to update DE is increased by γ to equal (1 UI+γ). The delay γ provides additional time to complete the delay $T_{C,Q}+T_{MUX,SO}+T_{SU}$ through flip-flop 404B, multiplexer 403C, and flip-flop 404A. The delay between each rising edge of SCLK2 and the next rising edge of SCLK1 is reduced by γ to equal (γ−1 UI) without adversely affecting the operation of PRE circuit 400, because the output signal DES of multiplexer 403C is transmitted directly to the select input of multiplexer 403F. The delay can be substantial relative to the duration of a unit interval, i.e., the delay γ can be 10%, 15%, 20%, 25%, 30%, or more of a unit interval. In this example, the delay between each rising edge of SCLK1 and the next rising edge of SCLK2 is 110%, 115%, 120%, 125%, 130%, or more of a unit interval, and the delay between each rising edge of SCLK2 and the next rising edge of SCLK1 is 90%, 85%, 80%, 75%, 70%, or less of a unit interval, respectively.

In one embodiment, the delay γ in PRE circuit 400 is equal to $T_F/2$, where $T_F = T_{C,Q} + T_{SU}$. In this embodiment, the timing constraint of equation (2) becomes $T_{MUX} + T_F/2 < 1$ (UI) in PRE circuit 400, which provides a substantial reduction in this timing constraint relative to an implementation of PRE circuit 400 in which clock signals SCLK1 and SCLK2 are 180° out of phase.

After each rising edge in SCLK2, flip-flop 404A updates the value of DE based on the new value of DES. Then, multiplexers 403A-403B, 403C, and 403F update signals DES and DOS based on the updated value of DE. However, the next rising edge in SCLK1 causes flip-flop 404B to capture the value of DOS as sampled bit DO before multiplexer 403F updates DOS based on the value of DE that was updated in response to the preceding rising edge of SCLK2. The delay γ can be increased to reduce the possibility of a hold time violation in flip-flop 404B.

The longest signal path through PRE circuit 400 is the path from flip-flop 404B, through multiplexers 403C and 403F, and back to flip-flop 404B. In PRE circuit 400, the sum of the clock-to-Q delay $T_{C,Q}$ of flip-flop 404B, the select-to-out delay $T_{MUX,SO}$ of multiplexer 403C, the select-to-out delay $T_{MUX,SO}$ of multiplexer 403F, and the setup delay $T_{SU}$ of flip-flop 404B is less than two unit intervals (UI), as shown in equation (3) above, where N=2.

In an alternative embodiment of PRE circuit 400, non-sequential logic circuitry (e.g., inverters) is coupled between the output of multiplexer 403C and the select input of multiplexer 403F. The logic circuitry drives signal DES to the select input of multiplexer 403F.

Figure 5A:
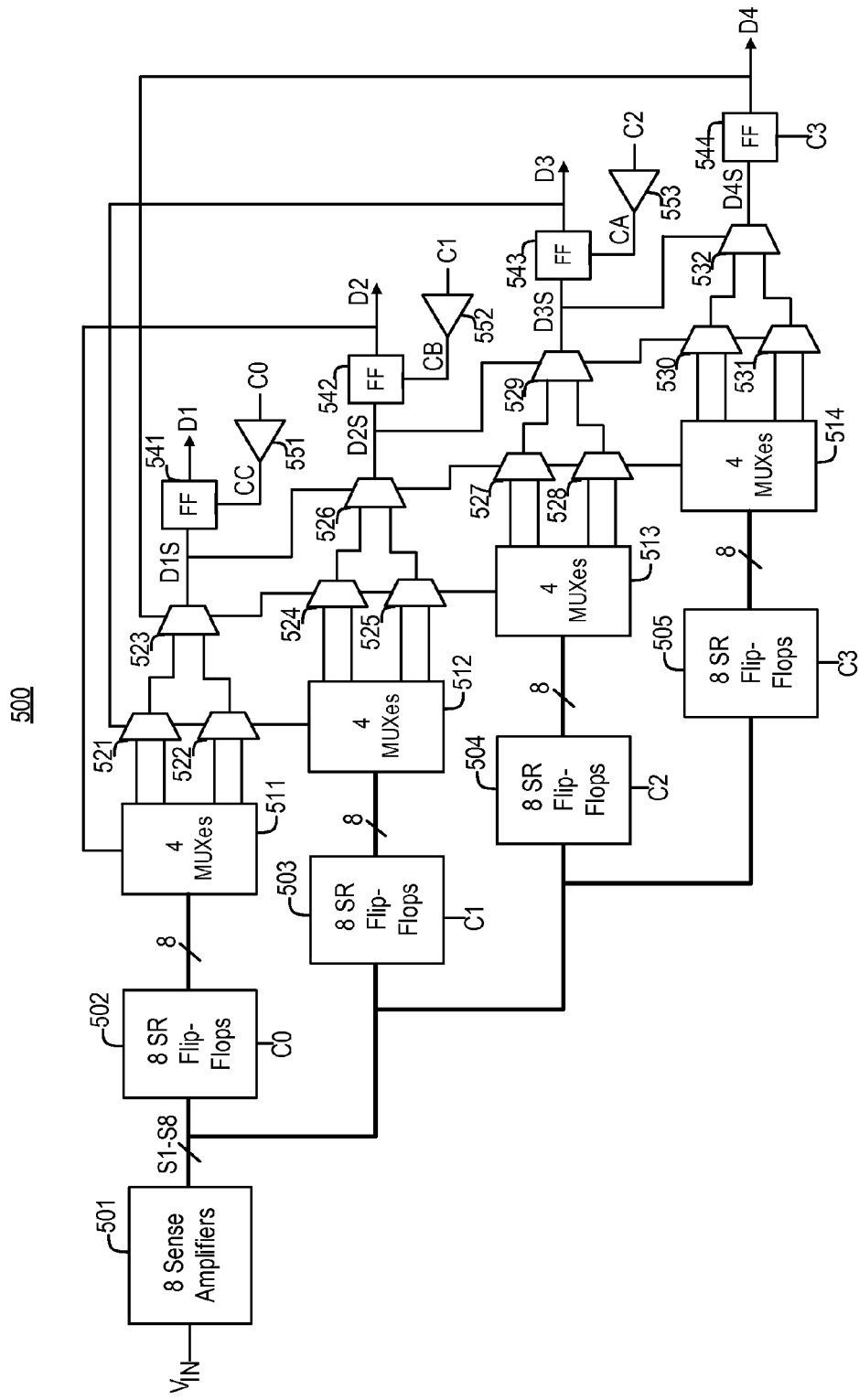
FIG. 5A illustrates an example of a PRE circuit that uses a time borrowing technique and that generates each sampled bit based on the values of three previously sampled bits.

FIG. 5A illustrates an example of a partial response equalizer (PRE) circuit 500 that uses a time borrowing technique and that generates each sampled bit based on the values of three previously sampled bits. PRE circuit 500 is a 3-tap PRE circuit. PRE circuit 500 samples an input signal that has a quad data rate (QDR) with respect to the sampling clock signal.

PRE circuit 500 receives an input voltage signal $V_{IN}$ that represents an incoming data signal. PRE circuit 500 generates sampled bits from input signal $V_{IN}$ using time borrowing. PRE circuit 500 samples input signal $V_{IN}$ using clock signals C0, C1, C2, and C3 to generate sampled signals, selects 4 of the sampled signals as sampled bits D1-D4 that represent input signal $V_{IN}$ in 4 unit intervals, and stores the sampled bits in storage circuits. Each sampled bit is selected based on the values of 3 previously sampled bits.

Four unit intervals occur in each clock period of clock signals C0-C3 in PRE circuit 500. Each unit interval corresponds to a bit period in $V_{IN}$. V has a quad data rate (QDR) with respect to sampling clock signals C0-C3. The techniques described herein can be extended to include PRE circuits that achieve virtually any data rate, including an octal data rate (i.e., 8 bits per sampling clock cycle), a decade data rate (i.e., 10 bits per sampling clock cycle), etc.

Figure 5B:
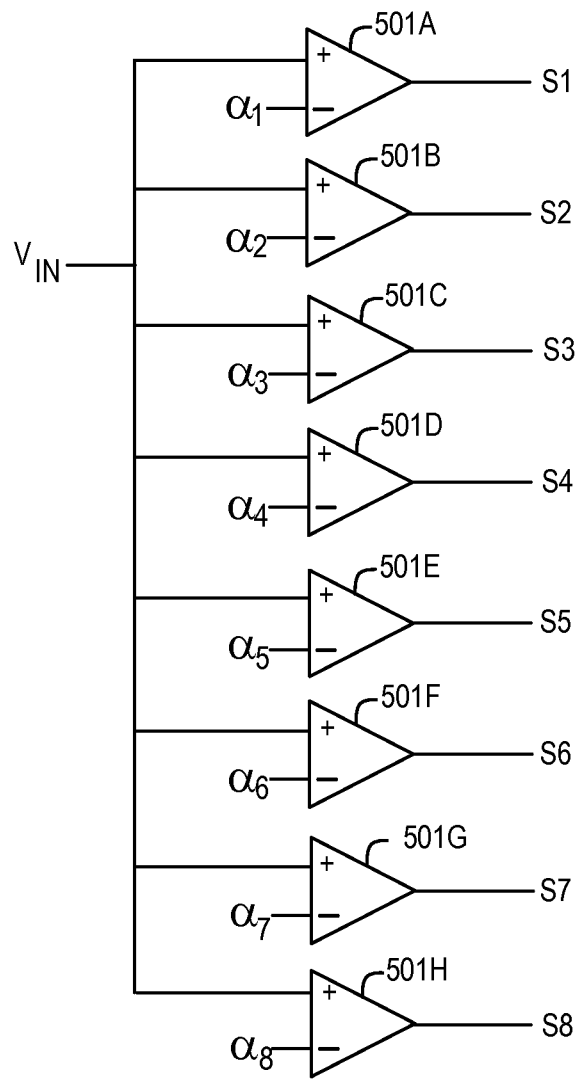
FIG. 5B illustrates examples of sense amplifiers in the PRE circuit of FIG. 5A.
Figure 5C:
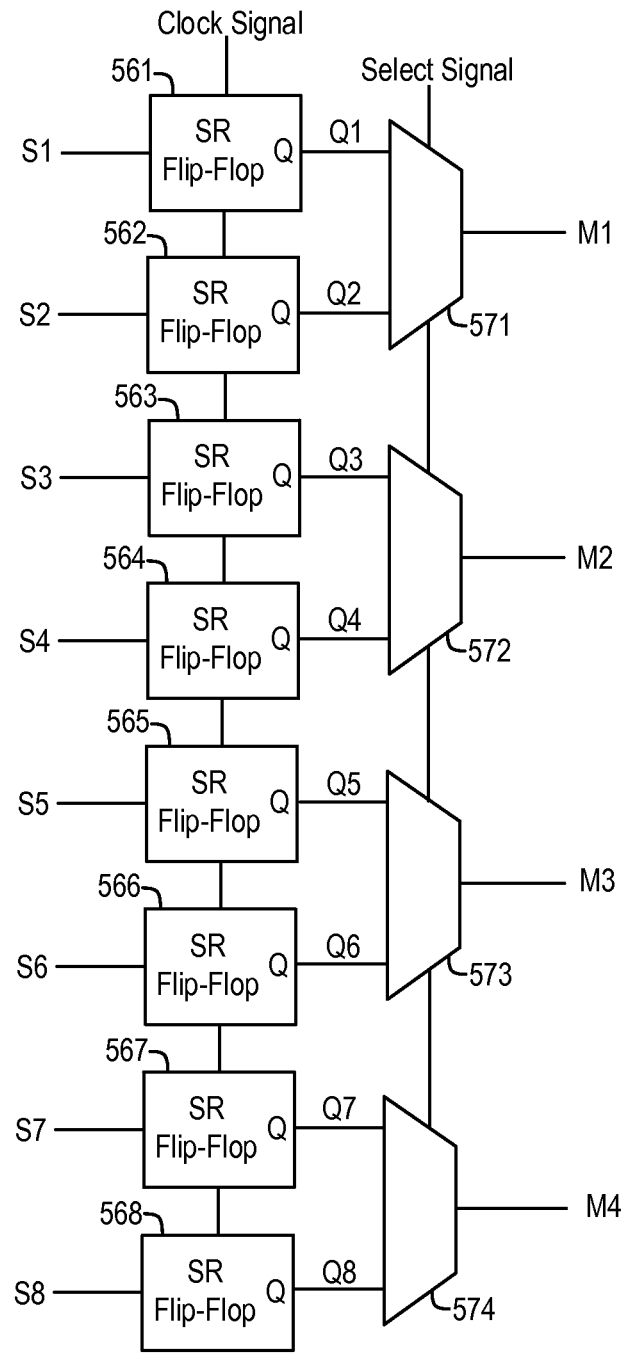
FIG. 5C illustrates examples of flip-flops and multiplexers in the PRE circuit of FIG. 5A.

PRE circuit 500 includes 8 sense amplifier circuits within circuit block 501, 8 SR flip-flops within each of the circuit blocks 502-505, 4 multiplexers within each of the circuit blocks 511-514, multiplexers 521-532, flip-flops 541-544, and clock buffers 551-553. The sense amplifiers in circuit block 501 are shown in detail in FIG. 5B. As shown in FIG. 5B, circuit block 501 includes 8 sense amplifiers 501A-501H. FIG. 5C illustrates 8 SR flip-flops 561-568 and 4 multiplexers 571-574. Each of the circuit blocks 502-505 includes SR flip-flops 561-568 coupled as shown in FIG. 5C. Each of the circuit blocks 511-514 includes multiplexers 571-574 coupled as shown in FIG. 5C.

The input voltage signal $V_{IN}$ is transmitted to input terminals of sense amplifier circuits 501A-501H as shown in FIG. 5B. Sense amplifier circuits 501A-501H compare $V_{IN}$ to threshold voltage signals $\alpha_1$, $\alpha_2$, $\alpha_3$, $\alpha_4$, $\alpha_5$, $\alpha_6$, $\alpha_7$, and $\alpha_8$ to generate sampled signals S1-S8 that are provided to inputs of each of the circuit blocks 502-505. The values of $\alpha_1$-$\alpha_8$ represent magnitudes of the partial response to the preceding bits in input signal $V_{IN}$ caused by ISI, i.e., assuming the preceding bits to have been 000, 001, 010, 011, 100, 101, 110, and 111, respectively.

Sense amplifier circuits 501A-501H and the SR flip-flops in circuit blocks 502-505 sample $V_{IN}$ to generate sampled signals. Circuit blocks 502-505 each have 8 SR flip-flops 561-568 that store the sampled signals generated by sense amplifiers 501A-501H as 8 sampled signals Q1-Q8 in response to rising edges in clock signals C0, C1, C2, and C3, respectively. Clock signals C0, C1, C2, and C3 have relative phases of 0°, 90°, 180°, and 270°, respectively. There are many different techniques for generating clock signals C0, C1, C2, and C3. Clock signals C0, C1, C2, and C3 can be generated, for example, by a delay-locked loop, a phase mixer, or a phase-locked loop.

Circuit blocks 511-514 each have 4 multiplexers 571-574 that receive 8 sampled signals Q1-Q8 from SR flip-flops 561-568, respectively, in a corresponding one of circuit blocks 502-505. The output signals of multiplexers 571-574 are M1-M4, respectively.

Circuit block 511 and multiplexers 521-523 select one of the sampled signals from circuit block 502 as sampled bit D1S based on the values of previously sampled bits D2, D3, and D4. Flip-flop 541 stores the value of D1S as sampled bit D1 in response to each rising edge in clock signal CC. Circuit block 512 and multiplexers 524-526 select one of the sampled signals from circuit block 503 as sampled bit D2S based on the values of D3, D4, and D1S. Flip-flop 542 stores the value of D2S as sampled bit D2 in response to each rising edge in clock signal CB.

Circuit block 513 and multiplexers 527-529 select one of the sampled signals from circuit block 504 as sampled bit D3S based on the values of D4, D1S, and D2S. Flip-flop 543 stores the value of D3S as sampled bit D3 in response to each rising edge in clock signal CA. Circuit block 514 and multiplexers 530-532 select one of the sampled signals from circuit block 505 as sampled bit D4S based on the values of D1S, D2S, and D3S. Flip-flop 544 stores the value of D4S as sampled bit D4 in response to each rising edge in clock signal C3.

Figure 5D:
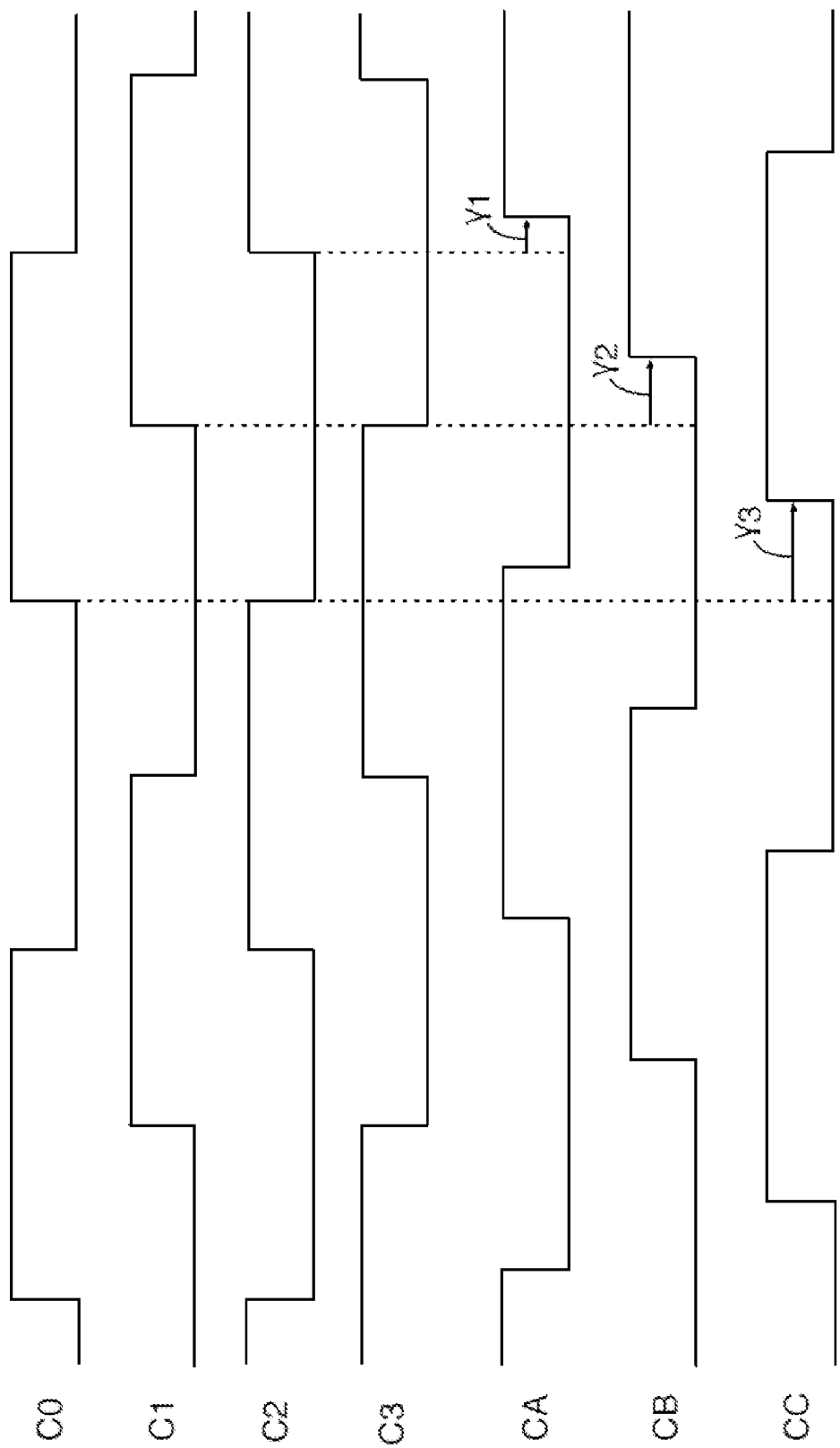
FIG. 5D is a timing diagram that illustrates example waveforms for the clock signals of FIG. 5A.

FIG. 5D is a timing diagram that illustrates example waveforms for clock signals C0, C1, C2, C3, CA, CB, and CC. In the example of FIG. 5D, each of the clock signals has a 50% duty cycle. In alternative embodiments, the clock signals shown in FIG. 5D have duty cycles that are greater than or less than 50%.

As shown in FIG. 5D, clock signals C0, C1, C2, and C3 are equally spaced apart in phase at 90° phase intervals. Clock buffer 551 delays clock signal CC by a delay of γ3 relative to the phase of clock signal C0. Clock buffer 552 delays clock signal CB by a delay of γ2 relative to the phase of clock signal C1. Clock buffer 553 delays clock signal CA by a delay of γ1 relative to the phase of clock signal C2. The relative phases of CA, CB, and CC can be shifted as shown in FIG. 5D without changing the clock periods of these signals.

In one embodiment, $\gamma 1 = T_F/4$, $\gamma 2 = T_F/2$, $\gamma 3 = 3T_F/4$, and $T_F = T_{C,Q} + T_{SU}$ for each of flip-flops 541-544. In this embodiment, PRE circuit 500 is subject to the timing constraints shown below in equations (4)-(7).

$$T_{MUX,SO} + T_F < 1(\text{UI}) + 3T_F/4 \quad (4)$$

$$(2 \times T_{MUX,SO}) + T_F < 2(\text{UI}) + T_F/2 \quad (5)$$

$$(3 \times T_{MUX,SO}) + T_F < 3(\text{UI}) + T_F/4 \quad (6)$$

$$(4 \times T_{MUX,SO}) + T_F < 4(\text{UI}) \quad (7)$$

Equation (4) can be reduced to $T_{MUX} + T_F/4 < 1$ (UI), which indicates a substantial reduction in this timing constraint. Equation (4) represents the timing constraint for the $T_{C,Q}$ of flip-flop 544, plus the $T_{MUX,SO}$ of multiplexer 523, plus the $T_{SU}$ of flip-flop 541 that occurs between the rising edge of C3 that causes flip-flop 544 to update D4 and the next rising edge of CC that causes flip-flop 541 to update D1. PRE circuit 500 implements time borrowing. The delay between each rising edge in C3 and the next rising edge of CC is increased by $3T_F/4$ to provide additional time to complete the delay $T_{C,Q} + T_{MUX,SO} + T_{SU}$ through flip-flop 544, multiplexer 523, and flip-flop 541, as shown in equation (4).

The delay between each rising edge of CC and the next rising edge of CB is reduced by $T_F/4$, the delay between each rising edge of CB and the next rising edge of CA is reduced by $T_F/4$, and the delay between each rising edge of CA and the next rising edge of C3 is reduced by $T_F/4$. The delays between these rising edges of the clock signals can be reduced without adversely affecting the operation of PRE circuit 500, because the output signals of multiplexers 523, 526, and 529 are transmitted directly to the select inputs of multiplexers 526, 529, and 532, respectively.

Equation (5) represents the timing constraint for the $T_{C,Q}$ of flip-flop 544, plus the $T_{MUX,SO}$ of multiplexer 523, plus the delay $T_{MUX,SO}$ of multiplexer 526, plus the $T_{SU}$ of flip-flop 542 that occurs between the rising edge of C3 that causes flip-flop 544 to update D4 and the next rising edge of CB that causes flip-flop 542 to update D2. The delay between each rising edge in C3 and the next rising edge of CB is increased by $T_F/2$ to provide additional time to complete the delays through these circuits.

Equation (6) represents the timing constraint for the $T_{C,Q}$ of flip-flop 544, plus the $T_{MUX,SO}$ of multiplexer 523, plus the $T_{MUX,SO}$ of multiplexer 526, plus the $T_{MUX,SO}$ of multiplexer 529, plus the $T_{SU}$ of flip-flop 543 that occurs between the rising edge of C3 that causes flip-flop 544 to update D4 and the next rising edge of CA that causes flip-flop 543 to update D3. The delay between each rising edge in C3 and the next rising edge of CA is increased by $T_F/4$ to provide additional time to complete the delays through these circuits.

Equation (7) represents the timing constraint for the $T_{C,Q}$ of flip-flop 544, plus the $T_{MUX,SO}$ of multiplexer 523, plus the $T_{MUX,SO}$ of multiplexer 526, plus the $T_{MUX,SO}$ of multiplexer 529, plus the $T_{MUX,SO}$ of multiplexer 532, plus the $T_{SU}$ of flip-flop 544 that occurs within each period of C3 (i.e., within 4 UIs). The longest signal path delay in PRE circuit 500 is shown in equation (3), where N=4.

Figure 6A:
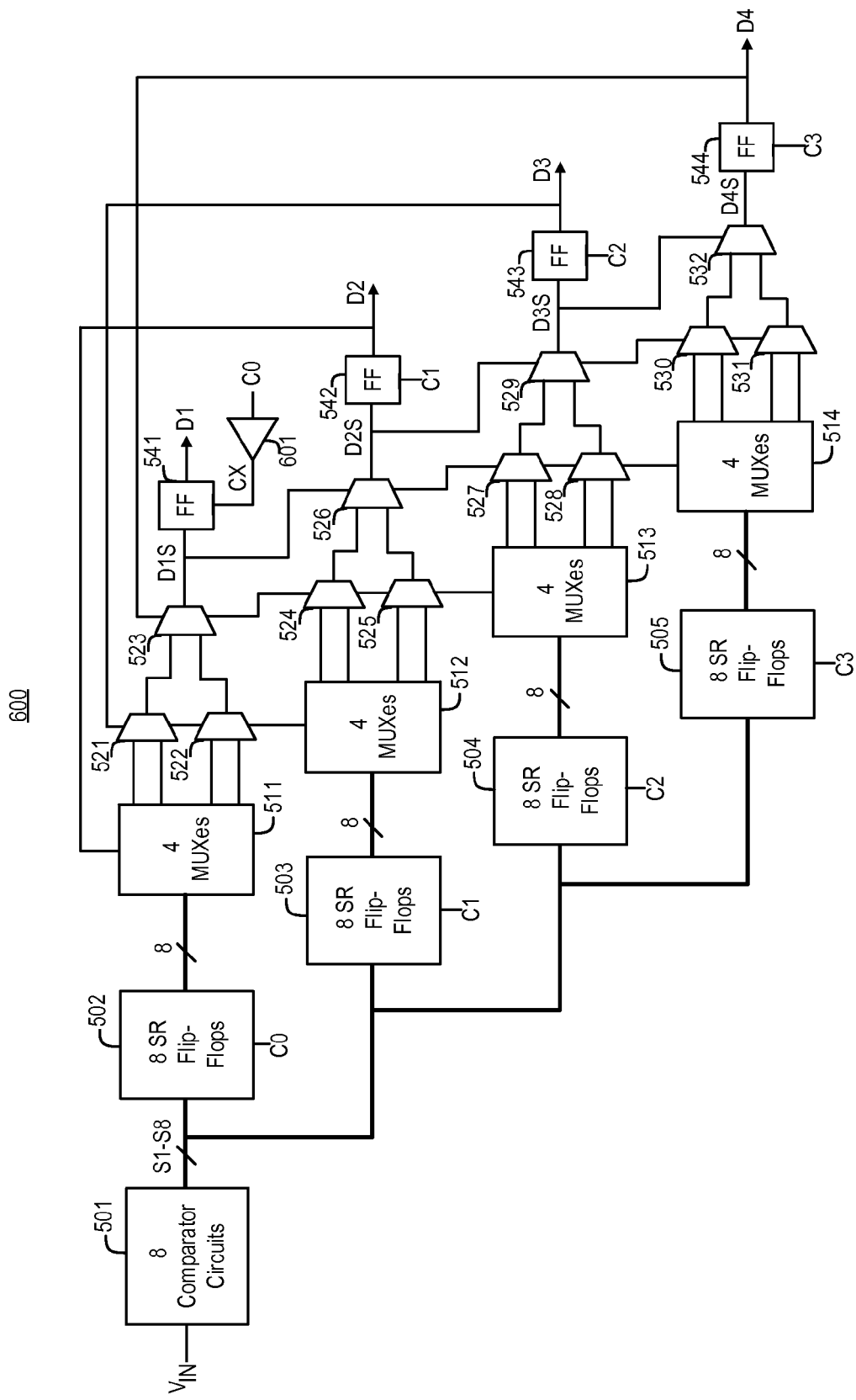
FIG. 6A illustrates another example of a PRE circuit that uses a time borrowing technique and that generates each sampled bit based on the values of three previously sampled bits.

FIG. 6A illustrates another example of a partial response equalizer (PRE) circuit 600 that uses a time borrowing technique and that generates each sampled bit based on the values of three previously sampled bits. PRE circuit 600 is also a 3-tap PRE circuit. PRE circuit 600 samples an input signal that has a quad data rate (QDR) with respect to the sampling clock signal.

PRE circuit 600 includes the same circuit elements as PRE circuit 500, except clock buffers 551-553. Instead, PRE circuit 600 has a clock buffer 601. The clock signals used to clock flip-flops 541-544 in PRE circuit 600 have different phase relationships than the clock signals that clock flip-flops 541-544 in PRE circuit 500. In PRE circuit 600, clock signal CX clocks flip-flop 541, clock signal C1 clocks flip-flop 542, clock signal C2 clocks flip-flop 543, and clock signal C3 clocks flip-flop 544.

Clock buffer 601 generates clock signal CX in response to clock signal C0. FIG. 6B is a timing diagram that illustrates example waveforms for clock signals C0, C1, C2, C3, and CX. As shown in FIG. 6B, clock buffer 601 provides a delay of γ to clock signal CX relative to the phase of clock signal C0.

In one embodiment, $\gamma = T_F/2$, and $T_F = T_{C,Q} + T_{SU}$ for each of flip-flops 541-544. In this embodiment, PRE circuit 600 is subject to the timing constraints shown below in equations (8)-(11).

$$T_{MUX,SO} + T_F < 1(\text{UI}) + T_F/2 \quad (8)$$

$$(2 \times T_{MUX,SO}) + T_F < 2(\text{UI}) \quad (9)$$

$$(3 \times T_{MUX,SO}) + T_F < 3(\text{UI}) \quad (10)$$

$$(4 \times T_{MUX,SO}) + T_F < 4(\text{UI}) \quad (11)$$

Equation (8) can be reduced to $T_{MUX} + T_F/2 < 1$ (UI). Equation (8) represents the timing constraint for the $T_{C,Q}$ of flip-flop 544, plus the $T_{MUX,SO}$ of multiplexer 523, plus the $T_{SU}$ of flip-flop 541 that occurs between the rising edge of C3 that causes flip-flop 544 to update D4 and the next rising edge of CX that causes flip-flop 541 to update D1. PRE circuit 600 also implements time borrowing. The delay between each rising edge in C3 and the next rising edge of CX is increased by $T_F/2$ to provide additional time to complete the delay $T_{C,Q} + T_{MUX,SO} + T_{SU}$ through flip-flop 544, multiplexer 523, and flip-flop 541, as shown in equation (8). The delay between each rising edge in CX and the next rising edge in C1 is reduced by $T_F/2$.

Equation (9) represents the timing constraint for the $T_{C,Q}$ of flip-flop 544, plus the $T_{MUX,SO}$ of multiplexer 523, plus the $T_{MUX,SO}$ of multiplexer 526, plus the $T_{SU}$ of flip-flop 542 that occurs between each rising edge of C3 and the next rising edge of C1. Equation (10) represents the timing constraint for the $T_{C,Q}$ of flip-flop 544, plus the $T_{MUX,SO}$ of multiplexer 523, plus the $T_{MUX,SO}$ of multiplexer 526, plus the $T_{MUX,SO}$ of multiplexer 529, plus the $T_{SU}$ of flip-flop 543 that occurs between each rising edge of C3 and the next rising edge of C2. Equation (11) represents the timing constraint for the $T_{C,Q}$ of flip-flop 544, plus the $T_{MUX,SO}$ of multiplexer 523, plus the $T_{MUX,SO}$ of multiplexer 526, plus the $T_{MUX,SO}$ of multiplexer 529, plus the $T_{MUX,SO}$ of multiplexer 532, plus the $T_{SU}$ of flip-flop 544 that occurs within each period of C3.

In alternative embodiments of PRE circuits 500 and 600, non-sequential logic circuits (e.g., inverters) are coupled between the outputs of multiplexers 523, 526, and 529 and the select inputs of multiplexers 526, 529, and 532 in the transmit paths of signals D1S, D2S, and D3S, respectively.

In other embodiments of the PRE circuits described herein, the flip-flops can be substituted with latches or another suitable type of storage circuit. Suitable storage circuits may either rely on static or dynamic storage techniques, which may store logic values temporarily by charging or discharging a capacitor.

A receiver containing one of the partial response equalizers described herein can be used in any suitable integrated circuit, such as, for example, a memory integrated circuit or a controller integrated circuit. The receiver containing the partial response equalizer can, e.g., be used to sample input data received from an external source before the data is stored in memory cells inside the memory integrated circuit (e.g., a DRAM or SRAM chip).

The teachings provided herein can be readily extended to additional systems that rely upon sampler circuits using multiple thresholds, such as 4-PAM systems. PAM refers to pulse amplitude. The design for additional embodiments having multiple thresholds is generally similar to the embodiment described herein. These additional embodiments can involve additional sampler paths and multi-bit connections between the multiplexers.

The embodiments shown in the figures and described herein can be implemented in hardwired electronic circuitry, in software code stored on a computer readable medium, or using a combination of hardwired circuitry and software.

The foregoing description of the exemplary embodiments has been presented for the purposes of illustration and description. The foregoing description is not intended to be exhaustive or limiting to the examples disclosed herein. In some instances, features described herein can be employed without a corresponding use of other features as set forth. Many modifications, substitutions, and variations are possible in light of the above teachings.

What is claimed is:

1. An integrated circuit (IC) comprising:
    an input pin to receive an input data signal;
    first sampler circuits to sample the input data signal on first clock-signal edges and relative to different first and second thresholds to produce first and second sampled signals;
    second sampler circuits to sample the input data signal on second clock-signal edges, out of phase with the first clock-signal edges, and relative to different third and fourth thresholds to produce third and fourth sampled signals;
    a first multiplexer having: first multiplexer data inputs coupled to the first sampler circuits to receive the first and second sampled signals; a first-multiplexer select input; and a first-multiplexer output;
    a second multiplexer having: second multiplexer data inputs coupled to the second sampler circuits to receive the third and fourth sampled signals; a second-multiplexer select input asynchronously coupled to the first-multiplexer output; and a second-multiplexer output; and
    a storage circuit having a storage-circuit input coupled to the second-multiplexer output, a clock input, and a storage-circuit output coupled to the first-multiplexer select input.

2. The IC of claim 1, wherein the first and second thresholds are different from the third and fourth thresholds.

3. The IC of claim 1, further comprising a second storage circuit having a second storage-circuit input coupled to the first-multiplexer output, a second clock input, and a second storage-circuit output.

4. The IC of claim 1, the clock input to receive third clock-signal edges out of phase with respect to the first and second clock-signal edges.

5. The IC of claim 4, further comprising a second storage circuit having a second storage-circuit input coupled to the second multiplexer output, a second storage-circuit output, and a second clock input to receive a fourth clock-signal edges output of phase with the third clock-signal edges.

6. The IC of claim 5, wherein at least one of the third and fourth clock-signal edges are of a clock signal out of phase with the first and second clock-signal edges.

7. The IC of claim 6, wherein the first and second clock-signal edges are of complementary timing signals.

8. The IC of claim 1, wherein the first multiplexer data inputs number more than two.

9. The IC of claim 1, wherein the second multiplexer data inputs number more than two.

10. The IC of claim 1, wherein each sampler circuit includes a sense amplifier circuit and a flip-flop.

11. A method comprising:
    receiving an input signal;
    generating first samples of the input signal with respect to first thresholds and timed to first clock-signal edges;
    generating second samples of the input signal with respect to second thresholds and timed to second clock-signal edges out of phase with respect to the first clock-signal edges;
    asynchronously selecting between the second samples responsive to the first samples to produce a first selected signal;
    sampling the first selected signal with respect to third clock-signal edges; and
    synchronously selecting between the first samples responsive to the sampled first selected signal to produce a second selected signal.

12. The method of claim 11, wherein the first and second selected signals represent alternating bits of the input signal.

13. The method of claim 11, wherein the first clock-signal edges are out of phase with respect to the second clock-signal edges.

14. The method of claim 13, wherein the first and second clock-signal edges are of complementary clock signals.

15. The method of claim 11, wherein the first thresholds are of a number greater than two.

16. The method of claim 11, wherein the third clock-signal edges are out of phase with respect to the first and second clock-signal edge.

17. A non-transitory computer-readable medium having stored thereon code defining a receiver, the medium comprising:
    first code representing an input pin to receive an input data signal;
    second code representing first sampler circuits to sample the input data signal on first clock-signal edges and relative to different first and second thresholds to produce first and second sampled signals;
    third code representing second sampler circuits to sample the input data signal on second clock-signal edges, out of phase with the first clock-signal edges, and relative to different third and fourth thresholds to produce third and fourth sampled signals;
    fourth code representing a first multiplexer having: first multiplexer data inputs coupled to the first sampler circuits to receive the first and second sampled signals; a first-multiplexer select input; and a first-multiplexer output;
    fifth code representing a second multiplexer having: second multiplexer data inputs coupled to the second sampler circuits to receive the third and fourth sampled signals; a second-multiplexer select input asynchronously coupled to the first-multiplexer output; and a second-multiplexer output; and sixth code representing a storage circuit having a storage-circuit input coupled to the second-multiplexer output, a clock input, and a storage-circuit output coupled to the first-multiplexer select input.

18. The medium of claim 17, further comprising seventh code representing a second storage circuit having a second storage-circuit input coupled to the first-multiplexer output, a second clock input, and a second storage-circuit output.

19. The medium of claim 17, the clock input to receive third clock-signal edges out of phase with respect to the first and second clock-signal edges.

20. The medium of claim 19, further comprising seventh code representing a second storage circuit having a second storage-circuit input coupled to the second multiplexer output, a second storage-circuit output, and a second clock input to receive a fourth clock-signal edges output of phase with the third clock-signal edges.

* * * * *